(12) United States Patent
Walkup et al.

(10) Patent No.: US 6,247,953 B1
(45) Date of Patent: Jun. 19, 2001

(54) SINGLE-POINT DRIVING MECHANISM OF A ZIF PGA SOCKET AND THE SOCKET USING THE SAME

(75) Inventors: William B. Walkup, Hillsboro, OR (US); Wen-Chun Pei, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/327,213

(22) Filed: Jun. 7, 1999

(51) Int. Cl.[7] .................................................. H01R 13/625
(52) U.S. Cl. .............................................................. 439/342
(58) Field of Search ..................................... 439/342, 259, 439/268, 264, 263, 260, 261, 266

(56) References Cited

U.S. PATENT DOCUMENTS

| | | | |
|---|---|---|---|
| 4,420,205 | * 12/1983 | Kirkman | 439/342 |
| 4,988,310 | * 1/1991 | Bright et al. | 439/342 |
| 5,707,247 | * 1/1998 | Konstad | 439/342 |
| 5,730,615 | * 3/1998 | Lai et al. | 439/342 |

* cited by examiner

*Primary Examiner*—Neil Abrams
(74) *Attorney, Agent, or Firm*—Wei Te Chung (57) ABSTRACT

A driving mechanism is used for a socket which comprises a cover movably mounted on a base. The driving mechanism comprises a first reception space defined in the cover, a second reception space defined in the base and communicating with the first reception space, a driving cam having an upper portion rotatably retained in the first reception space of the cover and a lower portion rotatably and movably retained in the second reception space of the base. The upper portion of the driving cam is operative to rotate the lower portion of the driving cam in the second reception space which is subjected to reactive force from inner wall of the second reception space so that as the cam rotates it also moves linearly, thereby forcing the upper portion of the driving cam to pulling the cover to translate on the base.

19 Claims, 7 Drawing Sheets

SINGLE-POINT DRIVING MECHANISM OF A ZIF PGA SOCKET AND THE SOCKET USING THE SAME

BACKGROUND OF THE INVENTION

1. Field of the Invention

The present invention relates to a driving mechanism of a ZIF socket and the socket using the same, and especially to a single-point driving mechanism which drives a cover of the socket to move with respect to a base thereof in opposite directions thus rendering the socket in either a closed status or an open status.

2. The Prior Art

Conventional ZIF PGA sockets normally comprise a cover defining a plurality of upper passageways therein and slidably engaging with a base having a corresponding number of lower passageways retaining contacts therein. The upper passageways and the lower passageways are in constant communication with each other when the cover is moved with respect to the base. A cam is received in a space defined between the cover and the base and operative to move the cover with respect to the base thereby positioning the socket at either an open status ready for insertion of pins of a CPU package or a closed status forcing the pins of the CPU package to abut against the corresponding contacts. When the socket is in the open status, the pins of the CPU package are inserted into the upper passageways and the lower passageways with a substantially zero insertion force, but are not in electrical contact with the contacts retained in the lower passageways. The cam is then operated to drive the cover to move laterally relating to the base thereby urging the pins of the CPU package to electrically connect with the contacts of the base. U.S. Pat. No. 5,730,615 which belongs to the same assignee of this application has disclosed a driving mechanism for driving the cover to move with respect to the base from a single side of the socket by inserting a screwdriver into slots defined in the cover and the base and pivoting the screwdriver to drive the cover. This driving mechanism may be easily manipulated for moving the cover in one direction but it is difficult to be manipulated in opposite direction. This is because the slots may be vertically in alignment with each other when the socket is in an open status (or closed status) but they are not vertically in alignment with each other when the socket is in a closed status (or open status). The user has to insert the screwdriver to the two slots in a slanted manner thus causing difficulty when the two slots are not vertically in alignment with each other. Moreover, when the user pivots the screwdriver he (she) may be prohibited by peripheral components nearby thus causing difficulty.

It is requisite to provide a new driving mechanism which is easily manipulated without much operation space.

SUMMARY OF THE INVENTION

The primary purpose of the present invention is to provide an improved driving mechanism for a socket which is easily manipulated and only needs relatively small operation space.

In accordance with one aspect of the present invention, a driving mechanism is provided for driving a socket which comprises a cover movably mounted on a base. The driving mechanism comprises a first hole defined in the cover. A second hole is defined in the base and it has an upper opening in communication with the first hole and a lower opening in communication with the upper opening, wherein the upper opening is larger than the lower opening. A driving cam has an upper circular portion rotatably retained in a predetermined angular range in the first hole of the cover, a middle cam portion movably retained in the upper opening of the second hole of the base, and a lower cam portion movably retained in the lower opening of the second hole of the base. The cover is movable along a first direction with respect to the base when the upper circular portion of the driving cam is rotated clockwise while the cover is movable along a second direction opposite to the first direction when the upper circular portion of the driving cam is rotated counter-clockwise.

In accordance with one aspect of the present invention, a socket comprises a cover defining a first reception space. A base is movably engaged with the cover and defines a second reception space and a third reception space, wherein the second reception space is larger than the third reception space and it is communicated between the first reception space and the third reception space. A driving cam has an upper circular portion rotatably retained in a predetermined angular range in the first reception space, a middle cam portion rotatably and movably retained in the second reception space, and a lower cam portion rotatably and movably retained in the third reception space. The cover is translated along a first direction with respect to the base when the upper circular portion of the driving cam is rotated clockwise while the cover is translated along a second direction opposite to the first direction when the upper circular portion of the driving cam is rotated counter-clockwise.

DETAILED DESCRIPTION OF THE PREFERRED EMBODIMENT

Figure 1A:
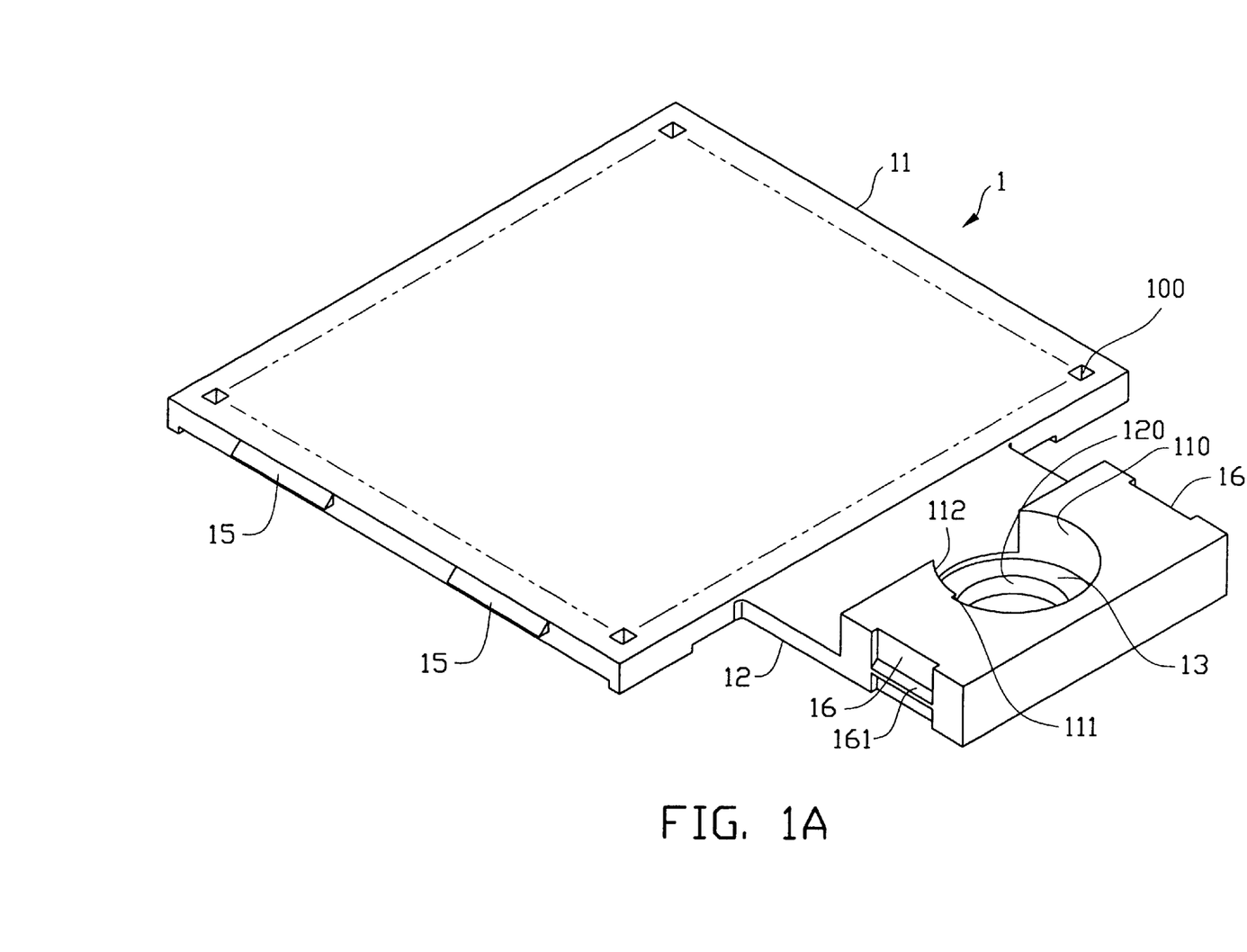
FIG. 1A is a perspective view of a base of a connector in accordance with the present invention.

Referring to FIG. 1A, a base 1 of a connector in accordance with the present invention comprises a housing 11 and a head 12 extending from the housing 11. The housing 11 has two sliders 15 formed in opposite sides thereof and defines a plurality of passageways 100 receiving contacts (not shown) therein for electrically and mechanically connecting to CPU pins (not shown) inserted thereinto. The head 12 defines a groove 16 in opposite sides thereof and a rib 161 extending from each groove 16. An upper hole 110 and a lower hole 120 communicating with the upper hole 110 are defined in the head 12. The upper hole 110 is larger than the lower hole 120 and an inner circular flange 13 is formed around the lower hole 120. A cutout 112 is defined in a periphery portion of the upper hole 110 as a gate therefore the upper hole 110 is assessable from a horizontal direction in addition to a vertical direction. Also referring to FIG. 1B, an upper stop 110A and a lower stop 120A are respectively formed in inner periphery of the upper hole 110 and the lower hole 120.

Figure 2:
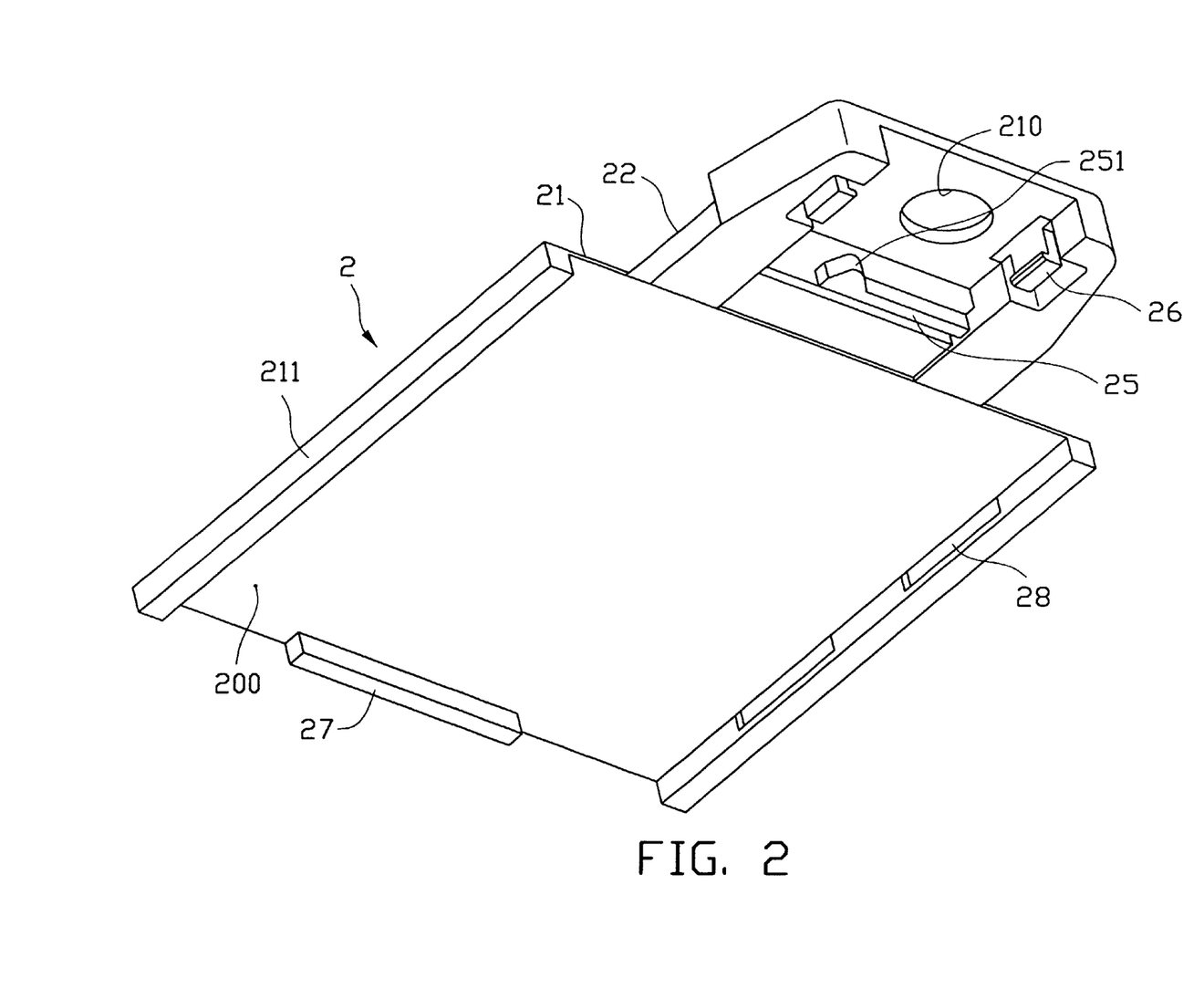
FIG. 2 is a schematic view of a cover of the connector of the invention taken from a bottom direction.

Referring to FIG. 2, a cover 2 adapted to be slidably engaged with the base 1 comprises a body portion 21 and a head 22 extending from the body portion 21. Two guiding arms 211 extend from opposite sides of the body portion 21 and each guiding arm 211 has two guiding recess 28 formed in inner surface thereof for slidably receiving the sliders 15 of the base 1 when the cover 2 is assembled to the base 1. A stopping bar 27 extends from a bottom surface of the body portion 21 substantially in alignment with rear side thereof for limiting a slidable distance of the cover 2 with respect to the base 1. The head 22 of the cover 2 has two resilient clamps 26 extending downward for slidably engaging with the ribs 161 of the base 1 when the cover 2 is assembled to the base 1. A positioning hole 210 is defined in the head 22 of the cover 2 and it is in alignment with the upper hole 110 of the base 1. A resilient beam 25 extends laterally from an inner wall of the cover 22 and includes an angled head 251 pointing to a lateral direction substantially parallel to a longitudinal axis of the cover 2.

Figure 3:
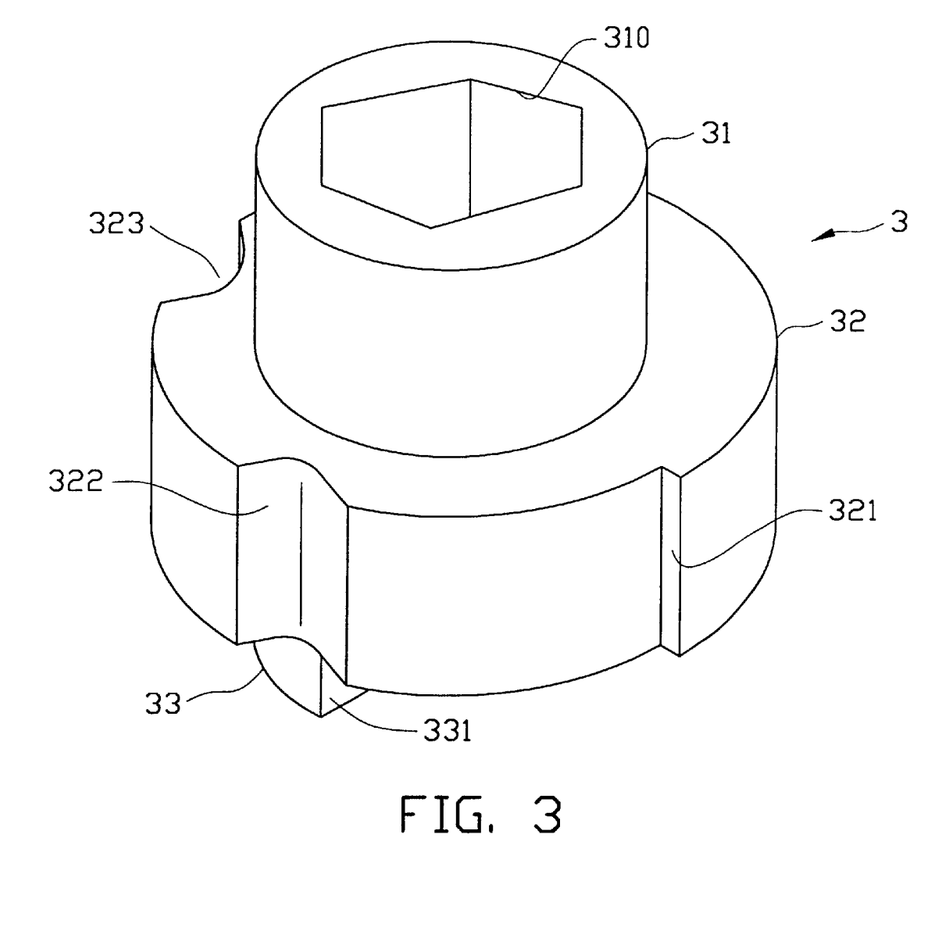
FIG. 3 is a perspective view of a driving cam in accordance with the present invention.

Referring to FIG. 3, a driving cam 3 comprises an upper circular portion 31, for actuating the cover 2, connected to a middle cam portion 32 connected to a lower cam portion 33. A tool reception hole 310, herein a hexagonal hole, is defined through the driving cam 3 allowing an external tool (not shown), such as a hexagonal wrench to operate therewith to rotate the driving cam 3. The tool reception hole 310 may be alternatively formed as a slit or a cross shape allowing other screwdrivers to operate therewith. The circular portion 32 is sized to be rotatable received in the positioning hole 210 of the cover 2. The middle cam portion 32 has a similar shape to the upper hole 110 of the base 1 and includes an upper protrusion 321 extending from a periphery thereof. A first groove 322 and a second groove 323 are defined in the periphery of the middle cam portion 32 and the two grooves 322, 323 are distanced from each other by substantially a sectional periphery of ninety degrees. The lower cam portion 33 has a lower protrusion 331 extending from a periphery thereof similar to the upper protrusion 321 formed in the middle cam portion 32.

Figure 1B:
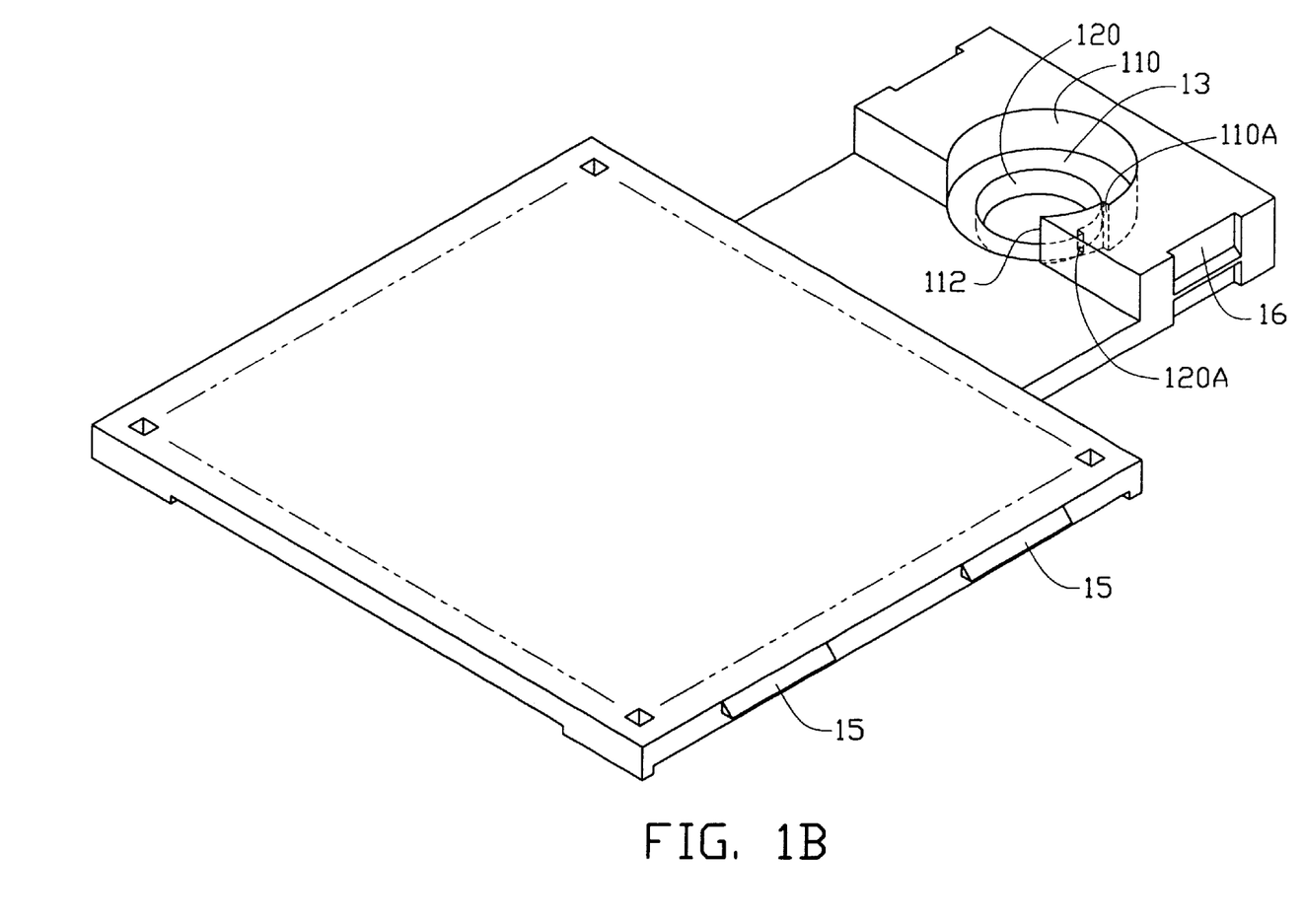
FIG. 1B is a perspective view of the base of FIG. 1A taken from a different angle and a portion thereof is shown by phantom line.
Figure 4:
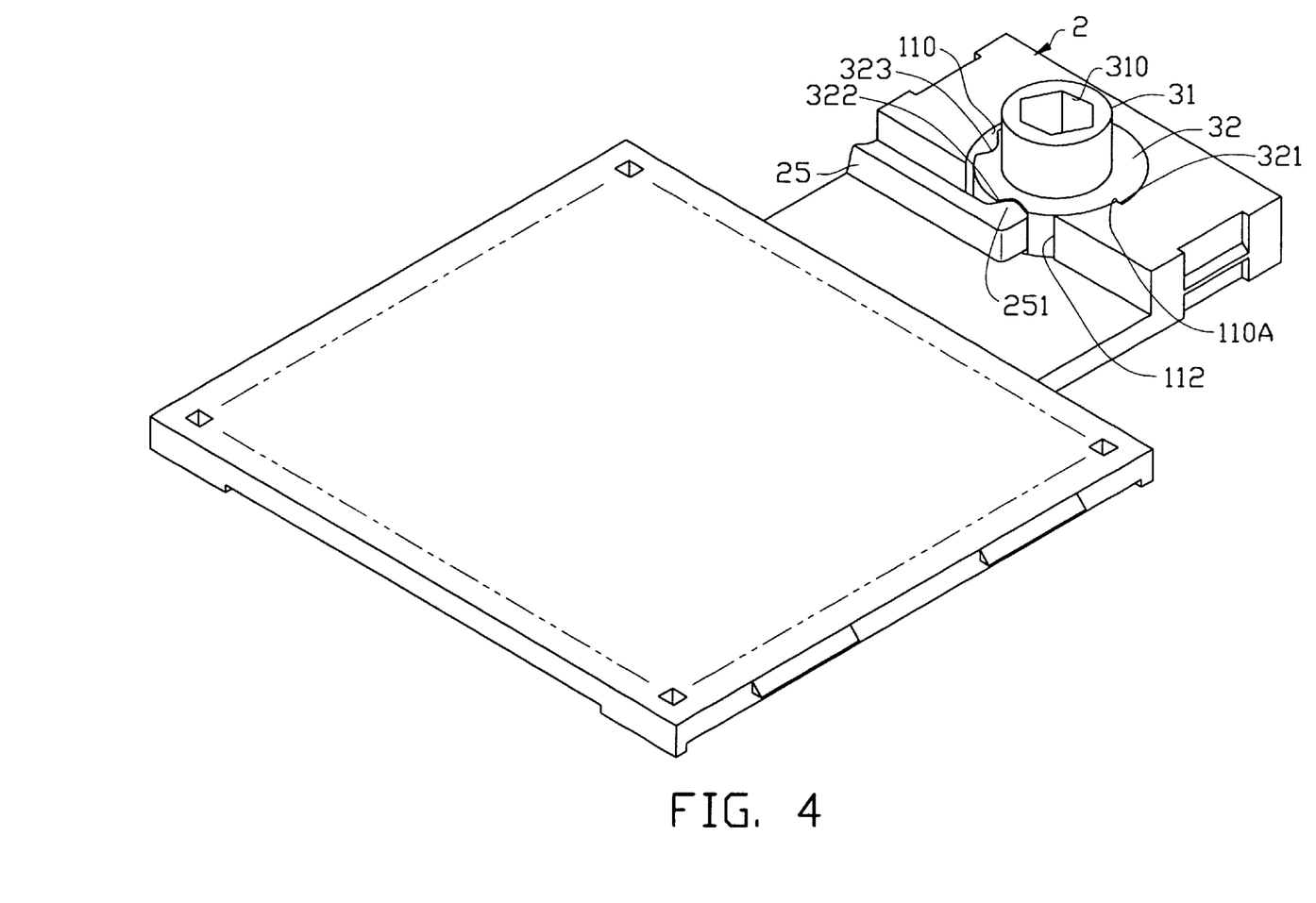
FIG. 4 is a perspective view showing the movable interconnection between the base, the driving cam, and a resilient beam of the cover.

Referring to FIG. 4, the middle cam portion 32 and the lower cam portion 33 of the driving cam 3 are respectively received in the upper hole 110 and the lower hole 120 (see FIG. 1B) of the base 1, with the middle cam portion 32 being rotatably and movably seated on the inner flange 13 (see FIG. 1B). The circular portion 31 of the driving cam 3 is received in the positioning hole 210 of the cover 2. However, for illustration purpose, most parts of the cover 2 are omitted herein with only the resilient beam 25 being shown. A periphery portion of the middle cam portion 32 exposes laterally through the cutout 112 of the base 2 to abut against the head 251 of the resilient beam 25 of the cover 2.

Figure 5:
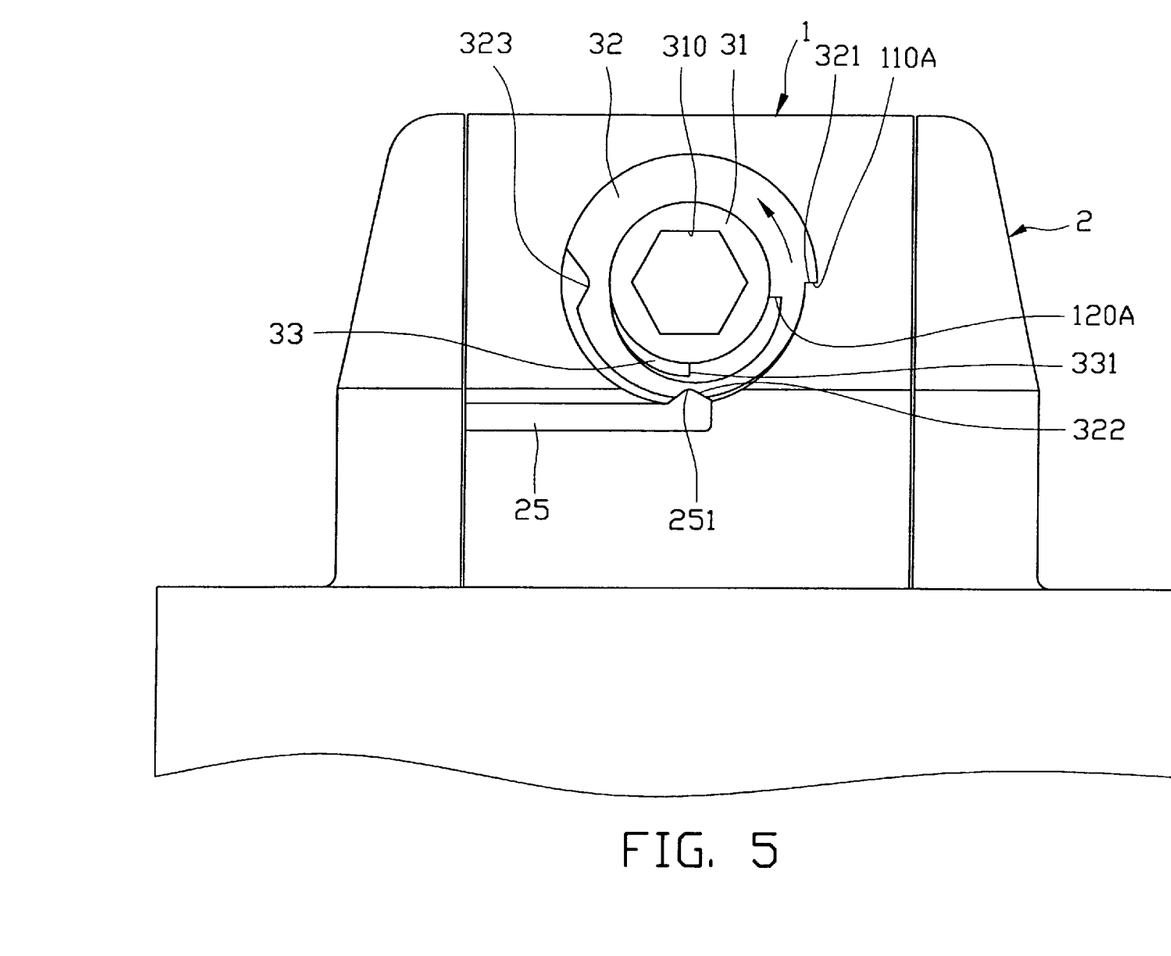
FIG. 5 is a schematic view showing the movable interconnection between the base, the driving cam, and the resilient beam of the cover when the connector is in an open status.
Figure 6:
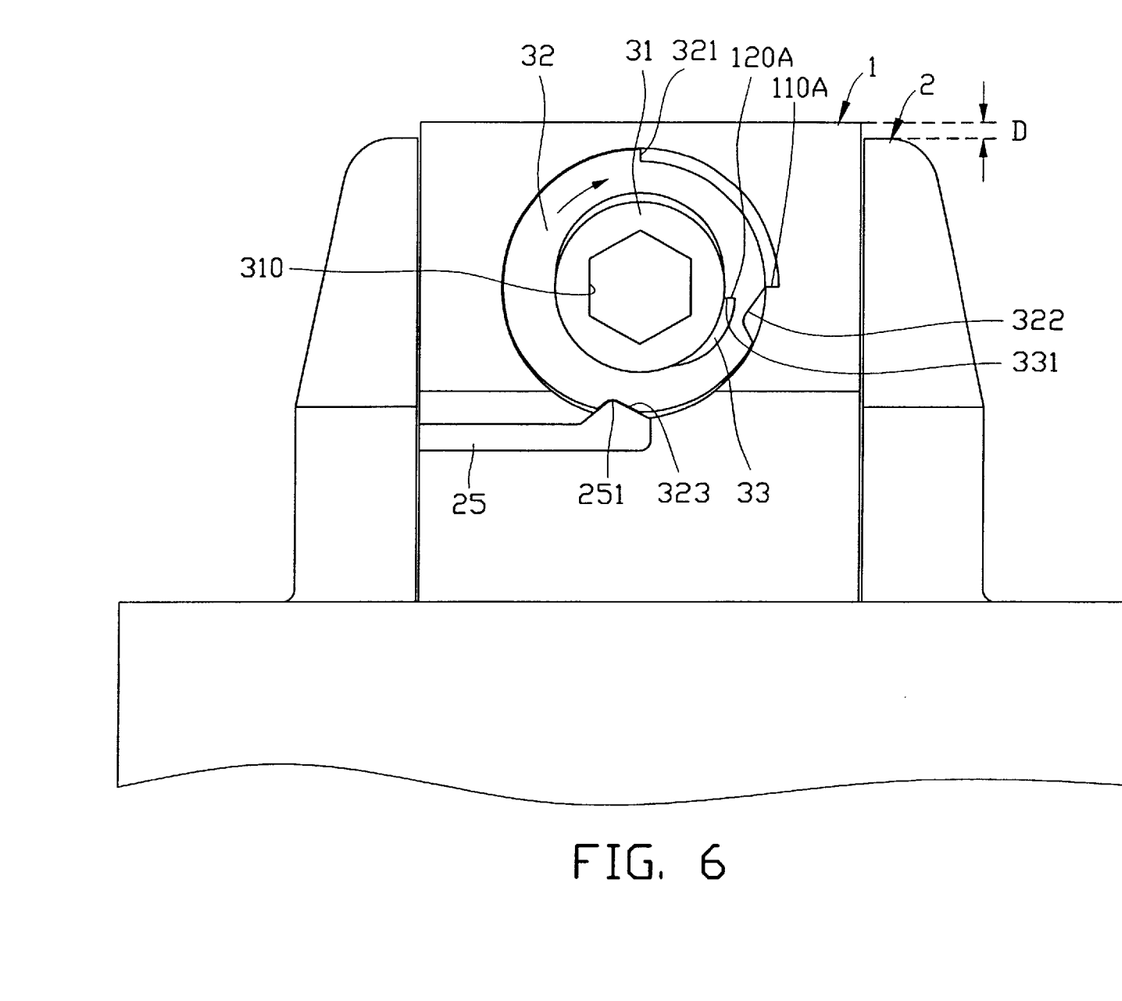
FIG. 6 is a schematic view showing the movable interconnection between the base, the driving cam, and the resilient beam of the cover when the connector is in a closed status.

The detailed operational relation between the driving cam 3, the base 1 and the cover 2 are shown in FIGS. 5 and 6. Firstly referring to FIG. 5, the connector is in an open status, wherein the protrusion 321 of the middle cam portion 32 abuts against the upper stop 110A of the upper hole 110 of the base 1 after the driving cam 3 has been rotated by the external tool clockwise to a first extreme. Simultaneously, the lower protrusion 331 of the lower cam portion 33 is distanced from the lower stop 120A and the angled head 251 of the resilient beam is clicked into the first groove 322 of the middle cam portion 32. The click caused by the angled head 251 and the first groove 322 of the middle cam portion 32 provides a user to have a good hand feeling that the connector has been operated in an open status.

Referring to FIG. 6, when the connector is operated from the open status to a closed status, the circular portion 31 is rotated counter-clockwise as shown by the arrow direction to a second extreme, and the protrusion 321 of the middle cam portion 32 is distanced from the upper stop 110A until the lower protrusion 331 of the lower cam portion 33 abuts against the lower stop 120A. Simultaneously, the angled head 251 of the resilient beam 25 is clicked into the second groove 323 of the middle cam portion 32. It can be seen that the cover 2 is moved for a distance D along the longitudinal axis thereof when the connector is changed from the open status to the closed status. Similarly, the connector is operative to change from the closed status to the open status by rotating the circular portion 31 clockwise as shown by an arrow of FIG. 6.

When the connector is operative from FIG. 5 to FIG. 6, the middle cam portion 32 is subjected to reactive force from inner wall of the upper hole 110 and performs rotation and movement thereby causing the circular portion 31 to drive the cover 2 to translate backward on the base 1. Similarly, when the connector is operative from FIG. 6 to FIG. 5, the lower cam portion 33 is subjected to reactive force from inner wall of the lower hole 120 and performs rotation and movement thereby causing the circular portion 31 to drive the cover 2 to translate forward on the base 1.

It should be noted that different from the traditional cam structure which has a camming surface rotating about a stationary pivot, the invention introduces a cam structure having the upper/lower hole 110/120 incorporating the middle/lower cam portion 32/33, wherein the middle/lower cam portion 32/33 are not only rotatably but also linearly moved with the corresponding the upper/lower hole 110/120. Under this situation, the upper circular portion 31 of the driving cam 3 may not only rotate but also move in a front-to-back direction, thus actuating the cover 2 to move in the front-to-back direction.

It is also noted that the middle cam portion 32 is generally of a circular form except that a gradually expansion section is formed with a ninety degrees range corresponding to the radius-increased dimension of the upper hole 110 about the first quadrant; similarly, the lower cam portion 33 is generally of a circular form except that a gradually expansion section is formed with a ninety degrees range corresponding to the radius-increased dimension of the lower hole 120 about the fourth quadrant. Therefore, through the engagement between the expansion section of the middle cam portion 32 and the upper hole 110, the driving cam can move rearward with regard to the base 1, while through the engagement between the expansion section of the lower cam portion 33, the driving cam can move forward with regard to the base 1. Understandably, the dimension of the upper hole 110 should be not only large enough to allow the middle cam portion 32 to rotate and linearly move in the front-to-back direction therein, but also small enough to allow the middle cam portion 32 to interact therewith for making a linear movement of the driving cam 3 with regard to the base 1 during rotation of the driving cam 3. Similarly, the lower hole 120 also follows the same format.

It is further noted that because such two expansion sections are diametrically positioned on the driving cam 3, such two expansions are preferably formed at two different levels as the invention for avoiding interference with the corresponding receiving hole if both two expansion sections are formed at the same level on the cam 3. Additionally, the middle cam portion 32 of the driving cam 3 is relatively larger than the upper circular portion 31 and the lower cam portion 33 and the corresponding holes 110, 210 and 120 are defined in the similar manner accordingly, so as to reliably retain the driving cam 3 within the socket without up-and-down movement.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A driving mechanism for a socket which comprises a cover movably mounted on a base, the driving mechanism comprising:
    a first hole defined in the cover;
    a second hole defined in the base and having an upper opening in communication with the first hole and a lower opening in communication with the upper opening, wherein the upper opening is larger than the lower opening;
    a driving cam having an upper circular portion rotatably retained in the first hole of the cover in a predetermined angular range, a middle cam portion rotatably and movably retained in the upper opening of the second hole of the base, and a lower cam portion rotatably and movably retained in the lower opening of the second hole of the base;
    whereby the cover is movable along a first direction with respect to the base when the upper circular portion of the driving cam is rotated clockwise while the cover is movable along a second direction opposite to the first direction when the upper circular portion of the driving cam is rotated counter-clockwise.

2. The driving mechanism as claimed in claim 1, wherein the predetermined angular range is substantially a range of ninety degrees.

3. The driving mechanism as claimed in claim 1, wherein the middle cam portion of the driving cam has a protrusion extending from a periphery thereof adapted to be blocked by an inner protrusion extending from an inner periphery of the upper opening of the second hole of the base when the circular portion is rotated to a first extreme of the predetermined angular range.

4. The driving mechanism as claimed in claim 3, wherein the lower cam portion of the driving cam has a protrusion extending from a periphery thereof adapted to be blocked by an inner protrusion extending from an inner periphery of the lower opening of the second hole of the base when the circular portion is rotated to a second extreme of the predetermined angular range.

5. The driving mechanism as claimed in claim 4, wherein the middle cam portion has two grooves formed in a periphery thereof, and the cover has a resilient beam having an angled head adapted to be received in one of the two grooves of the middle cam portion when the circular portion of the driving cam is rotated to one of the extremes of the predetermined angular range.

6. The driving mechanism as claimed in claim 5, wherein a cutout is formed in periphery of the upper opening thereby constituting a gate through which the angled head of the resilient beam of the cover can be received in one of the two grooves of the middle cam portion of the driving cam.

7. A driving mechanism for a socket which comprises a cover movably mounted on a base, the driving mechanism comprising a first reception space defined in the cover, a second reception space defined in the base and communicating with the first reception space, a driving cam having an upper portion rotatably retained in the first reception space of the cover and a lower portion rotatably and movably retained in the second reception space of the base, wherein the upper portion of the driving cam is operative to rotate the lower portion of the driving cam in the second reception space which in turn is activated by an inner wall of the second reception space to move in addition to rotation thereby forcing the upper portion of the driving cam to pulling the cover to translate on the base.

8. A socket comprises:
    a cover defining a first reception space;
    a base movably engaged with the cover and defining a second reception space and a third reception space, wherein the second reception space is larger than the third reception space and communicated between the first reception space and the third reception space;
    a driving cam having an upper circular portion rotatably retained in the first reception space in a predetermined angular range, a middle cam portion rotatably and movably retained in the second reception space, and a lower cam portion rotatably and movably retained in the third reception space;
    whereby the cover is translated along a first direction with respect to the base when the upper circular portion of the driving cam is rotated clockwise while the cover is translated along a second direction opposite to the first direction when the upper circular portion of the driving cam is rotated counter-clockwise.

9. The socket as claimed in claim 8, wherein the predetermined angular range is substantially a range of ninety degrees.

10. The socket as claimed in claim 8, wherein the middle cam portion of the driving cam has a protrusion extending from a periphery thereof adapted to be blocked by an inner protrusion extending from an inner periphery of the second reception space of the base when the circular portion is rotated to a first extreme of the predetermined angular range.

11. The socket as claimed in claim 10, wherein the the lower cam portion of the driving cam has a protrusion extending from a periphery thereof adapted to be blocked by an inner protrusion extending from an inner periphery of the third reception space of the base when the circular portion is rotated to a second extreme of the predetermined angular range.

12. The socket as claimed in claim 11, wherein the middle cam portion has two grooves formed in a periphery thereof, and the cover has a resilient beam having an angled head adapted to be received in one of the two grooves of the middle cam portion when the circular portion of the driving cam is rotated to one of the extremes of the predetermined angular range.

13. The socket as claimed in claim 12, wherein a cutout is formed in periphery of the second reception space thereby constituting a gate through which the angled head of the resilient beam of the cover can be received in one of the two grooves of the middle cam portion of the driving cam when the middle cam portion is rotated and moved in the second reception space.

14. A driving mechanism assembly comprising:

a stationary first member defining a first opening therein;

a moveable second member attached to said first member and adapted to move in a front-to-back direction with regard to the first member, said second member defining a second opening therein; and a driving cam defining a cam portion received within the first opening, and an actuation portion received within the second opening; wherein the first opening is properly dimensioned to have the driving cam not only rotatably moved with regard to the base, but also linearly moved with regard to the base in said front-to-back direction so as to have the second member move along said front-to-back direction accordingly.

15. The driving mechanism assembly as claimed in claim 14, wherein said actuation portion is snugly received within said second opening.

16. A driving mechanism assembly comprising:

a stationary first member defining therein an upper hole and a lower hole communicating with each other while with different shapes thereof, said upper hole defining a first radius-increased sector and said lower hole defining a second radius-increased sector; and a driving cam integrally including an upper cam portion and a lower cam portion corresponding to said upper hole and said lower hole, respectively; wherein said upper cam portion includes a first expansion section conformable with said first radius-increased sector of the upper hole, while said lower cam portion includes a second expansion section conformable with said second radius-increased sector of the lower hole.

17. The driving mechanism assembly as claimed in claim 16, wherein said first expansion section is diametrically positioned with regard to the second expansion section.

18. The driving mechanism assembly as claimed in claim 16, wherein said upper hole is radially larger than the lower hole.

19. A driving mechanism assembly comprising:

a first stationary member defining therein a first hole and a second hole communicating with each other;

a second moveable member attached to said first member and adapted to be moved with regard to the first member in a front-to-back direction, said second member defining an opening therein;

a driving member defining an upper portion, a middle portion and a lower portion respectively received within said opening, the first hole and the second hole; wherein said first hole is larger than said opening and said second hole, and said middle portion is larger than said upper portion and said lower portion, so that the driving member can be retained in the assembly.

* * * * *